(12) United States Patent
Bickford et al.

(10) Patent No.: US 8,963,620 B2
(45) Date of Patent: Feb. 24, 2015

(54) CONTROLLING CIRCUIT VOLTAGE AND FREQUENCY BASED UPON LOCATION-DEPENDENT TEMPERATURE

(71) Applicant: International Business Machines Corporation, Armonk, NY (US)

(72) Inventors: Jeanne P. S. Bickford, Essex Junction, VT (US); Eric A. Foreman, Fairfax, VA (US); David J. Hathaway, Underhill, VT (US); Mark W. Kuemerle, Essex Junction, VT (US); Susan K. Lichtensteiger, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/948,912

(22) Filed: Jul. 23, 2013

(65) Prior Publication Data

US 2015/0028937 A1 Jan. 29, 2015

(51) Int. Cl.
*H03L 7/00* (2006.01)
*G05F 1/46* (2006.01)

(52) U.S. Cl.
CPC . *G05F 1/463* (2013.01); *H03L 7/00* (2013.01)
USPC ........... 327/512; 327/513; 716/113; 716/133; 716/134

(58) Field of Classification Search
CPC ....................................................... G05F 1/463
USPC .......... 327/512, 513, 378, 538, 540; 716/113, 716/133, 134
See application file for complete search history.

(56) References Cited

U.S. PATENT DOCUMENTS

| 7,787,229 | B2 | 8/2010 | Deng et al. |
| 2006/0119397 | A1* | 6/2006 | Ferraiolo et al. ............... 327/31 |
| 2010/0290184 | A1 | 11/2010 | Tani |
| 2011/0029266 | A1 | 2/2011 | Lee |
| 2012/0249219 | A1* | 10/2012 | Shoemaker ................... 327/512 |

FOREIGN PATENT DOCUMENTS

| CN | 101826248 B | 2/2012 |
| CN | 20120099058 A | 5/2012 |
| CN | 102749979 A | 10/2012 |
| CN | 2012221301 A | 11/2012 |

(Continued)

OTHER PUBLICATIONS

U.S. Appl. No. 13/484,451, filed May 31, 2012.

(Continued)

*Primary Examiner* — Jung Kim
(74) *Attorney, Agent, or Firm* — David A. Cain; Hoffman Warnick LLC

(57) ABSTRACT

Various embodiments include approaches for controlling a supply voltage or a clock frequency to an integrated circuit (IC). Various additional embodiments include circuitry for controlling a supply voltage or a clock frequency of an IC. In some cases, a method includes: locating a set of temperature sensors on bin locations in an IC; determining temperature bounds of the bin locations in the IC as a function of a determined temperature at the set of temperature sensors; determining timing constraints as a function of supply voltages at the bin locations and the determined temperature at the set of temperature sensors; and determining operational voltage bounds for the IC as a function of the determined temperature at the set of temperature sensors.

9 Claims, 7 Drawing Sheets

(56) References Cited

FOREIGN PATENT DOCUMENTS

| WO | 2009058138 | A1 | 5/2009 |
| WO | 2012141182 | A1 | 10/2012 |

OTHER PUBLICATIONS

U.S. Appl. No. 13/749,851, filed Jan. 25, 2013.
U.S. Appl. No. 13/749,925, filed Jan. 25, 2013.

* cited by examiner

_(12) United States Patent_

CONTROLLING CIRCUIT VOLTAGE AND FREQUENCY BASED UPON LOCATION-DEPENDENT TEMPERATURE

TECHNICAL FIELD

Aspects of the invention relate generally to integrated circuits. More particularly, various aspects of the invention relate to controlling supply voltage and/or clock frequency in an integrated circuit.

BACKGROUND

Conventionally, integrated circuit (IC) designers use adaptive voltage scaling (AVS) as a technique to minimize power usage in their designs. In these approaches, the IC is monitored for performance parameters, and if the performance parameters are met, the voltage is lowered iteratively until reaching a lower bound. However, in use, ICs that are designed with AVS can be more susceptible to heat-based failure when their voltage is raised. Additionally, the localized front-end-of-the-line (FEOL) structures used to monitor temperature and voltage levels in these AVS ICs can provide inaccurate measurement and estimation of temperatures and voltage levels in the larger circuit. Even further, the measurement inaccuracies in these AVS ICs can require a guard band, which can increase design and fabrication complexity and costs.

BRIEF SUMMARY

Various embodiments include approaches for controlling a supply voltage or a clock frequency to an integrated circuit (IC). Various additional embodiments include circuitry for controlling a supply voltage or a clock frequency of an IC. In some cases, a method includes: locating a set of temperature sensors on bin locations in an IC; determining temperature bounds of the bin locations in the IC as a function of a determined temperature at the set of temperature sensors; determining timing constraints as a function of supply voltages at the bin locations and the determined temperature at the set of temperature sensors; determining operational voltage bounds for the IC as a function of the determined temperature at the set of temperature sensors; and constructing circuitry to control the supply voltage to the IC based upon the operational voltage bounds.

A first aspect includes a method of controlling a supply voltage to an integrated circuit (IC), the method including: locating a set of temperature sensors on bin locations in the IC; determining temperature bounds of the bin locations in the IC as a function of a determined temperature at the set of temperature sensors; determining timing constraints as a function of supply voltages at the bin locations and the determined temperature at the set of temperature sensors; and determining operational voltage bounds for the IC as a function of the determined temperature at the set of temperature sensors.

A second aspect of the invention includes a method of controlling a clock frequency of an integrated circuit (IC), the method including: locating a set of temperature sensors on bin locations in the IC; determining temperature bounds of the bin locations in the IC as a function of a determined temperature at the set of temperature sensors; determining timing constraints as a function of clock frequencies at the bin locations and the determined temperature at the set of temperature sensors; and determining operational clock frequency bounds for the IC as a function of the determined temperature at the set of temperature sensors.

A third aspect of the invention includes a circuit for controlling one of a supply voltage or a clock frequency of an integrated circuit (IC), the circuit having: a power supply pin coupled to the IC; a power supply regulator coupled to the power supply pin; a power supply control module coupled to the power supply regulator; and at least one temperature sensor on the IC for detecting a temperature of at least one bin location on the IC, the at least one temperature sensor coupled with the power supply control module, wherein the power supply control module is configured to control the one of the supply voltage or the clock frequency of the IC based upon the following: locating the at least one temperature sensor on the at least one bin location in the IC; determining temperature bounds of the at least one bin location in the IC as a function of a determined temperature at each of the at least one temperature sensor; determining timing constraints as a function of a supply voltage at each of the at least one bin location and the determined temperature at each of the at least one temperature sensor; and determining at least one of operational voltage bounds or operational frequency bounds for the IC as a function of the determined temperature at the set of temperature sensors.

Figure 1:
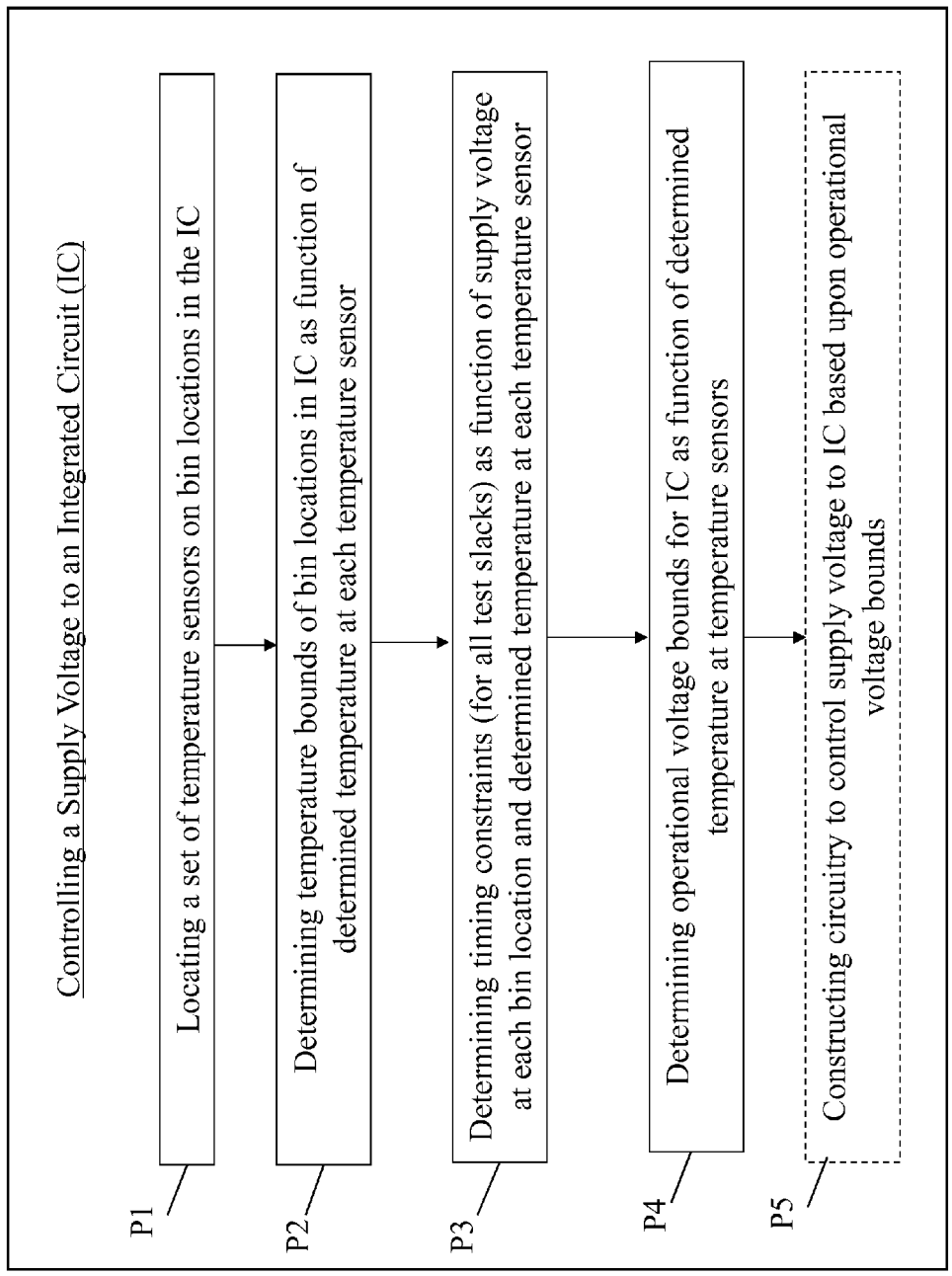
FIG. 1 shows a flow diagram depicting a process according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, aspects of the invention relate generally to integrated circuits. More particularly, various aspects of the invention relate to controlling supply voltage and/or clock frequency in an integrated circuit.

As described herein, conventionally, integrated circuit (IC) designers use adaptive voltage scaling (AVS) as a technique to minimize power usage in their designs. In these approaches, the IC is monitored for performance parameters, and if the performance parameters are met, the voltage is lowered iteratively until reaching a lower bound. However, in use, ICs that are designed with AVS can be more susceptible to heat-based failure when their voltage is raised. Additionally, the localized front-end-of-the-line (FEOL) structures used to monitor temperature and voltage levels in these AVS ICs can provide inaccurate measurement and estimation of temperatures and voltage levels in the larger circuit. Even further, the measurement inaccuracies in these AVS ICs can require a guard band, which can increase design and fabrication complexity and costs.

While prior approaches have examined correlations between voltage, temperature, performance, etc., in an IC, these prior approaches have looked at a single threshold, e.g., a single temperature threshold. However, this single temperature threshold approach is ineffective in large-scale chips with temperature gradients.

In contrast to these conventional approaches, various embodiments include methods that utilize a set of temperature sensors (e.g., at least two) on an IC to measure temperature across the IC (e.g., across the temperature gradient). In various embodiments, the set of sensors are separated from one another and in different bin locations on the IC. Having a plurality of temperature sensors can increase the accuracy of temperature measurement on the IC. Additionally, various aspects disclosed herein include correlating temperature with location on the IC, which can aid in identifying temperature conditions at distinct bin locations.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Various particular embodiments include a method of controlling a supply voltage to an integrated circuit (IC). Other particular embodiments include a method of controlling a frequency (e.g., a clock frequency) of an IC. Additional particular embodiments include a circuit for controlling a supply voltage and/or a clock frequency of an integrated circuit (IC).

Figure 2:
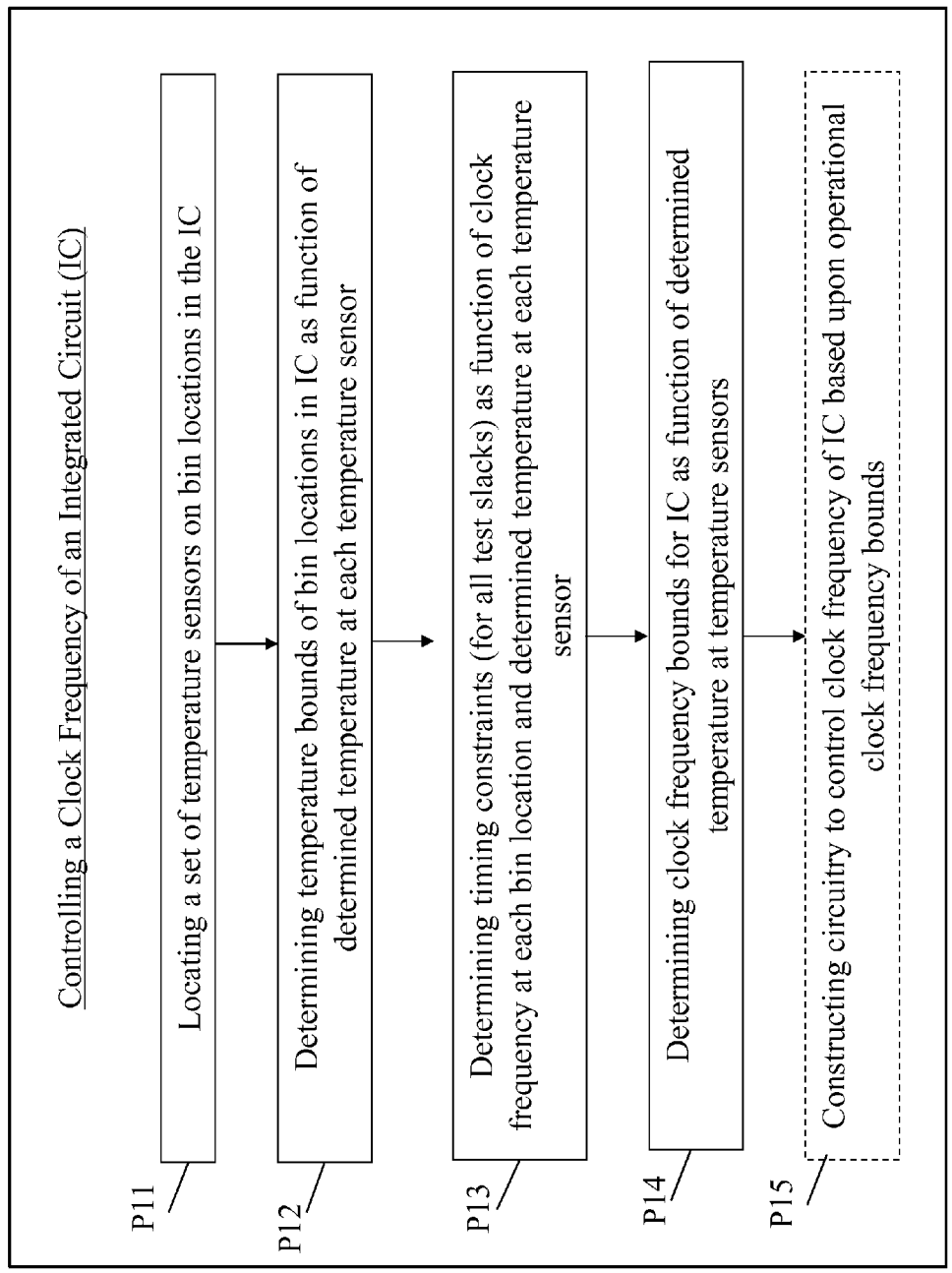
FIG. 2 shows a flow diagram depicting a process according to various alternative embodiments.
Figure 3:
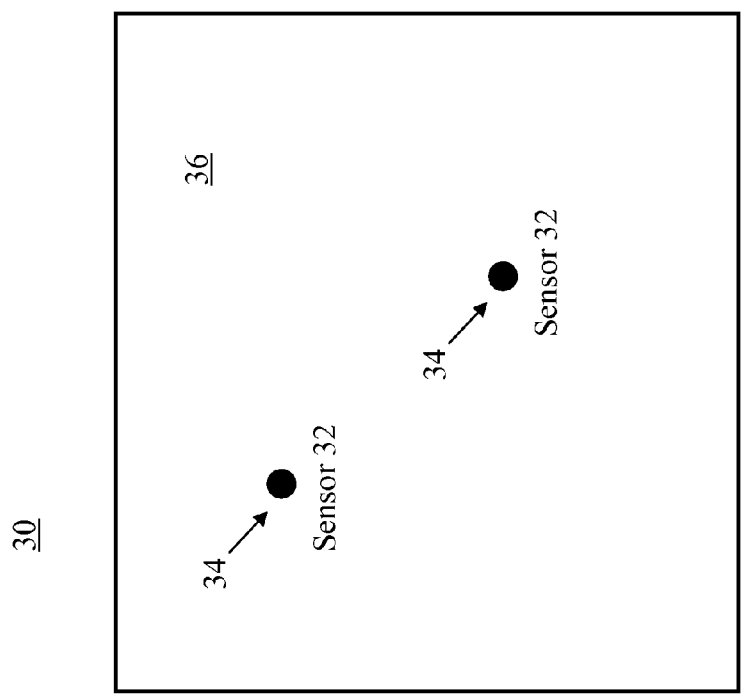
FIGS. 3-6 illustrate processes described in the flow diagrams of FIGS. 1-2, as they relate to an integrated circuit (IC) layout.

FIG. 1 depicts a flow diagram illustrating a process flow of a method of controlling a supply voltage to an IC according to various embodiments. FIG. 2 depicts a flow diagram illustrating a process flow of a method of controlling a frequency (e.g., a clock frequency) of an IC. As shown, the methods can include similar processes, based upon different parameters of an IC. These flow diagrams will be described with reference to the schematic layout diagrams in FIGS. 3-5.

Turning to FIG. 1, the flow diagram depicting the method of controlling a supply voltage to an IC can include the following processes:

P1: locating a set of temperature sensors 32 on bin locations 34 in the IC 36. In some cases, it may be beneficial to divide the area of IC 36 into physical regions, or bin locations 34. It is understood that bin locations 34 (or simply, bins) can refer to portions, or subsections of the IC 36. Because temperature and supply voltage typically vary gradually across an IC, the temperatures of all cells within any single bin location 34 will therefore vary only slightly from each other at any given point in time, and the supply voltages of all cells within any single bin location 34 will also vary only slightly from each other at any given point in time. As shown in the schematic IC layout diagram 30 in FIG. 3, the process of locating a set of temperature sensors can include placing at least one temperature sensor 32 on bin locations 34 in the IC 36. In some embodiments, the temperature sensor(s) 32 may be placed on the bin locations 34 of the IC 36 by a third party at a prior time. The temperature sensor(s) 32 can include any conventional temperature sensor, e.g., a piezo-electric temperature sensor, a laser-based temperature sensor, etc. In any case, locating the set of temperature sensors 32 can include logging or otherwise noting the bin locations 34 of the temperature sensors 32 such that each of the temperature sensors 32 is assigned to a known bin location 34. As described herein, the temperature sensors 32 can be uniformly distributed (separated from each adjacent sensor 32 by a substantially uniform distance) across the IC 36, or can be otherwise distributed across the IC 36. It is understood that as used herein, the term "set" can include any number equal to or greater than one (1), and excludes the known mathematical term referring to the null set (set of zero). However, in particular embodiments, a set of temperature sensors 32 can include two (2) or more sensors 32, and in other embodiments, the set of temperature sensors 32 can include at least four (4) temperature sensors 32. In some embodiments, the temperature sensors 32 are distributed evenly across the IC 36, such that a first sensor is separated from two distinct sensors by a uniform distance. In other cases, the temperature sensors 32 are distributed across the IC 36 in another configuration, for example, in locations that can be electrically isolated or switched, to allow for anticipated non-uniform distribution of power consumption and consequent non-uniform temperature variation across the IC.

Figure 4:
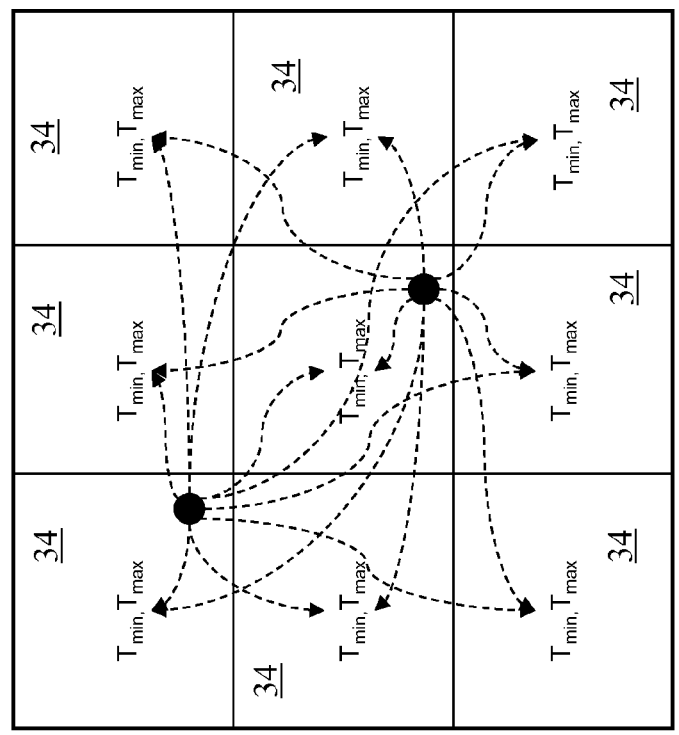

Process P2: After locating the temperature sensors 32, the method can include determining temperature bounds of the bin locations 34 in the IC 36 as a function of a determined temperature at each of the set of temperature sensors 32. FIG. 4 illustrates thermal relationships between temperature bounds ($T_{min}$, $T_{max}$) in each of a plurality of bin locations 34. These temperature bounds ($T_{min}$, $T_{max}$) can be based upon temperature data obtained from the temperature sensors 32 at each bin location 34, or upon estimates or extrapolations from measured bounds ($T_{min}$, $T_{max}$) at nearby temperature sensors 32. In various embodiments, determining the temperature bounds of the bin locations 34 includes the following sub-processes:

A) associating each bin location (i) with a designated closest temperature sensor ($S_i$);

B) performing a thermal analysis of the IC under multiple stimuli (j); and

C) determining the temperature bounds for each bin location (i) based upon the thermal analysis (under one or more stimuli (j).

In various embodiments, determining the temperature bounds further includes determining a maximum temperature ($T_{max,i}$) for each bin location (i) based on the measured temperature $T_{Si}$ of temperature sensor $S_i$ according to the following equation:

$$T_{max,i} = T_{Si} + \max_j(T_{i,j} - T_{Si,j}).$$ (Equation 1)

Where $T_{Si}$=a measured temperature at the closest temperature sensor ($S_i$) to the bin location (i); $T_{i,j}$=a calculated temperature at the bin location (i) in response to a stimulus (j); $T_{Si,j}$=a calculated temperature at the closest temperature sensor ($S_i$) in response to the stimulus (j); and $\max_j$=a function indicating take the maximum of the value in the following parentheses over all values of the stimulus (j).

Additionally, in some embodiments, determining the temperature bounds further includes determining a minimum temperature ($T_{min,i}$) for each bin location (i) according to the following equation:

$$T_{min,i} = T_{Si} - \max_j(T_{Si,j} - T_{i,j})$$ (Equation 2)

Where $T_{Si}$=a measured temperature at the closest temperature sensor ($S_i$) to the bin location (i); $T_{i,j}$=a calculated temperature at the bin location (i) in response to a stimulus (j); $T_{Si,j}$=a calculated temperature at the closest temperature sensor ($S_i$) in response to the stimulus (j); and $\max_j$=a function indicating take the maximum of the value in the following parentheses over all values of the stimulus (j).

In some cases, the IC 36 can operate under a plurality of process points, p. Each process point (p) may correspond to a different window within a maximum allowed range of manufacturing variation. Where the IC 36 includes a selective voltage binning (SVB) design having a plurality of SVB manufacturing variation windows (each represented by a process point (p)) each process point (p) may also correspond to a particular supply voltage to be applied to ICs with a particular manufacturing variation window represented by process point (p). In particular, determining the temperature bounds can further include determining at least one of a maximum temperature ($T_{max,i,p}$) for each bin location (i) and process point (p) or a minimum temperature ($T_{min,i,p}$) for each bin location (i) and process point (p) based on the measured temperature $T_{Si,i,p}$ of temperature sensor $S_i$ under process point (p) according to the at least one of the following equations:

$$T_{max,i,p} = T_{Si,p} + \max_j(T_{i,j,p} - T_{Si,j,p}); \quad \text{(Equation 3)}$$

or $$T_{min,i,p} = T_{Si,p} - \max_j(T_{Si,j,p} - T_{i,j,p}) \quad \text{(Equation 4)}$$

Where, for each process point (p) for each SVB location: $T_{Si,p}$=a measured temperature at the closest temperature sensor ($S_i$) to the bin location (i); $T_{i,j,p}$=a calculated temperature at the bin location (i) in response to a stimulus (j); $T_{Si,j,p}$=a calculated temperature at the closest temperature sensor ($S_i$) in response to the stimulus (j); and $\max_j$=a function indicating take the maximum of the value in the following parentheses over all values of the stimulus (j).

Figure 5:
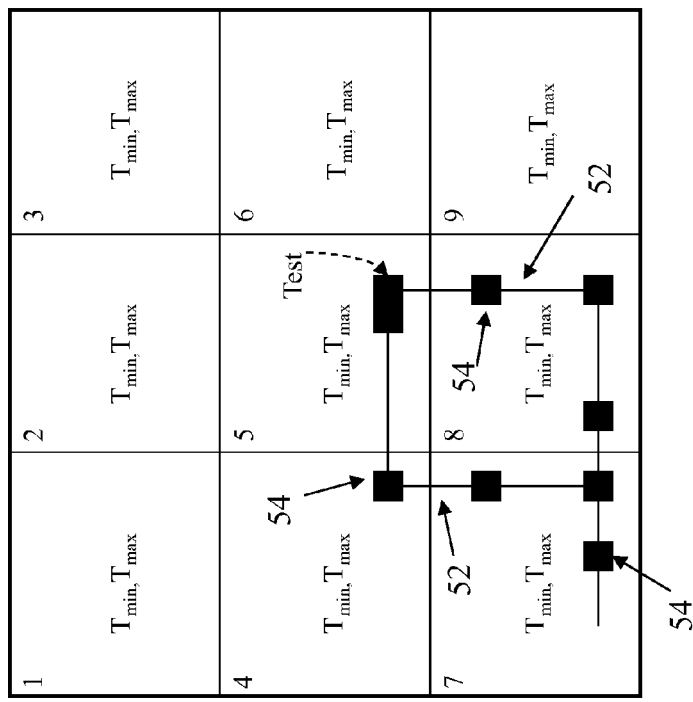

Process P3: Following the determining of temperature bounds of the bin locations 34 in the IC 36, the method can include determining timing constraints (e.g., for all test slacks) in the IC 36 as a function of a supply voltage and temperature at each bin location 34 and the determined temperature at each of the set of temperature sensors 32. It is known in the art that static timing analysis can include calculation of cell delays that depend on voltage, temperature, process point, and other parameters. Calculated delays can be summed along paths to compute arrival times, and differences between pairs of arrival times at particular cells (e.g., flip flops or latches) may be computed to produce slacks. The values of these slacks determine whether or not timing constraints have been met. Typically, a negative slack value indicates that the corresponding timing constraint has been violated. FIG. 5 illustrates timing paths 52 between a plurality of cells 54 located across several bin locations (labeled as 1-9 for the purposes of differentiation), including a Test cell at which a timing slack is computed. The slack at a given Test cell can be a function of timing measurements at other locations, supply voltage ($V_{DD}$), and/or process. The cells in the example paths of FIG. 5 are in bin locations 4, 5, 7, and 8, so the delays of those cells will be dependent on the temperatures of those bin locations 34. In equation form, Slack=f($T_4$, $T_5$, $T_7$, $T_8$, $V_{DD}$, Process).

Process P4: Following the determining of timing constraints for all test slacks in the IC 36, the method can include determining operational voltage bounds for the IC 36 as a function of the determined temperature at the set of temperature sensors 32. In various embodiments, the operational voltage bounds can be determined according to the following equations:

$$\text{Slack}=f(T_i, V_{DD}, \text{Process}); \text{ and} \quad \text{(Equation 5)}$$

$$V_{DD}=\max_k\{f(T_i(T_{sensor\_j}), \text{Slack}_k, \text{Process})\}. \quad \text{(Equation 6)}$$

It will be understood by one having skill in the art that equations 5 and 6 may be represented as analytic mathematical functions, data tables, or simulation models, or a combination of these and other means. The inversion of equation 5 to produce equation 6 may be performed by analytic inversion, inverse table lookup, root finding methods, iterative simulation, or a combination of these and other means, each of which are known by one having skill in the art.

Figure 6:
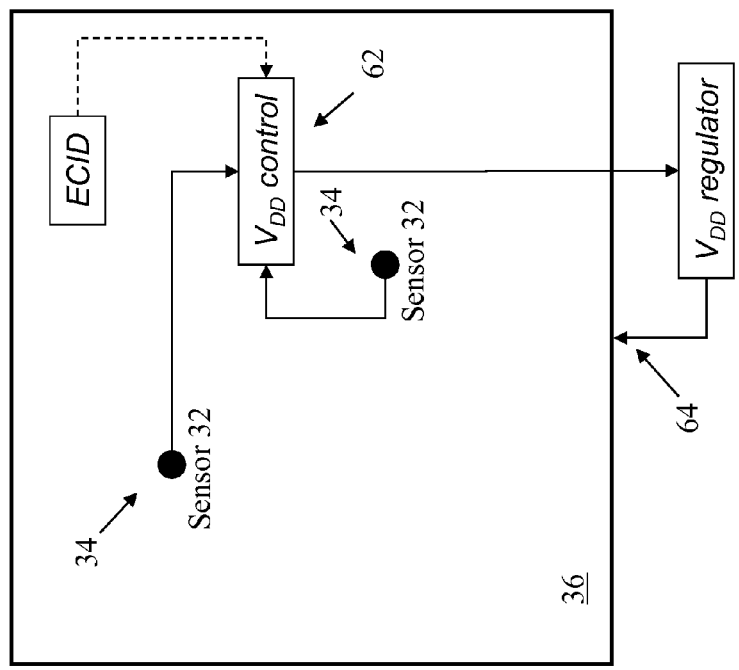

Process P5 (optional): In some cases, the method can further include constructing circuitry to control the supply voltage ($V_{DD}$) to the IC 36 based upon the operational voltage bounds determined in process P4. FIG. 6 depicts an illustrative control circuit 62 shown schematically overlying the IC 36. The control circuit 62 is for controlling one of a supply voltage or a clock frequency of the IC 36.

As shown, the control circuit 62 can include: a power supply pin 64 for coupling to the IC 36 and a power supply regulator ($V_{DD}$ regulator) coupled to the power supply pin 64. The control circuit 62 can also include a power supply control module ($V_{DD}$ control) coupled to the power supply regulator ($V_{DD}$ regulator). Additionally, the control circuit 62 can include at least one temperature sensor (e.g., sensor(s) 32) for coupling to the IC 36 and detecting a temperature of at least one bin location 34 on the IC 36. In various embodiments, the at least one temperature sensor 32 is coupled with the power supply control module ($V_{DD}$ control). In some cases, the power supply control module ($V_{DD}$ control) can include an electronic chip identifier (ECID), depicted in phantom, which may include encoding of the particular process point at which the particular IC instance was manufactured.

In various embodiments, the power supply control module ($V_{DD}$ control) is configured to provide a signal for controlling the one of the supply voltage or the clock frequency of the IC 36 based upon the temperature of the at least one bin location 34 on the IC 36.

It is understood that the process flow shown and described herein with reference to FIG. 1 (supply voltage), can be similarly described with respect to controlling a clock frequency of an IC (e.g., IC 36). FIG. 2 shows the process flow associated with a method of controlling a clock frequency of an IC 36, which includes the following processes:

P11: Locating a set of temperature sensors 32 on bin locations 34 in the IC 36;

P12: Determining temperature bounds of the bin locations 34 in the IC 36 as a function of a determined temperature at each of the set of temperature sensors 32;

P13: Determining timing constraints (e.g., for all test slacks) in the IC 36 as a function of a clock frequency at each of the bin locations 34 and the determined temperature at each of the set of temperature sensors 32;

P14: Determining operational clock frequency bounds for the IC 36 as a function of the determined temperature at the set of temperature sensors 32; and P15 (Optionally): Constructing circuitry (e.g., control circuit 62) to control the clock frequency of the IC 36 based upon the operational clock frequency bounds.

Figure 7:
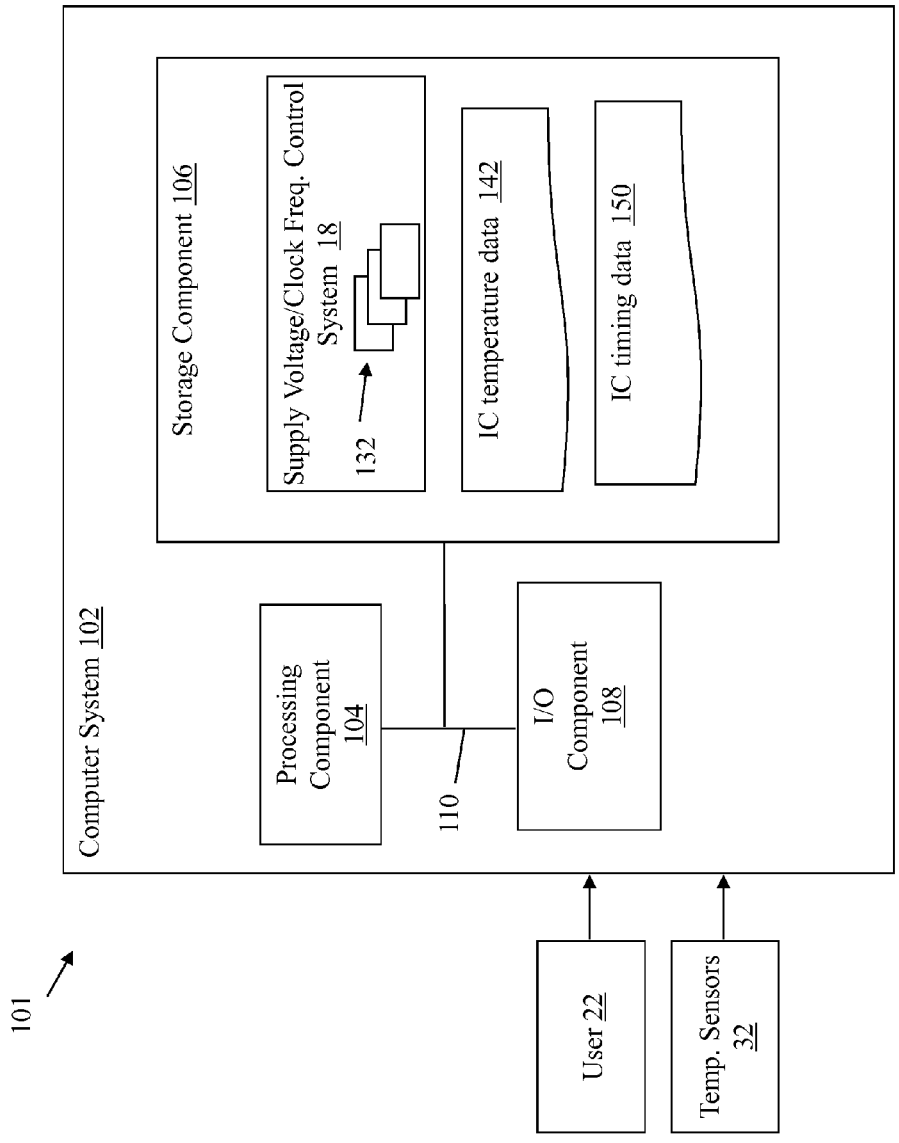
FIG. 7 shows a schematic environment for implementing a supply voltage/clock frequency control system according to various embodiments.

FIG. 7 depicts an illustrative environment 101 for controlling a supply voltage and/or clock frequency in an integrated circuit (IC) according to embodiments. To this extent, the environment 101 includes a computer system 102 that can perform a process described herein in order to control a supply voltage and/or clock frequency in an IC. In particular, the computer system 102 is shown as including a supply voltage/clock frequency control system 18, which makes computer system 102 operable to control a supply voltage and/or clock frequency in an IC by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the supply voltage/clock frequency control system 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 and the temperature sensors 32 to interact with the computer system 102 and/or one or more communications devices to enable a system user 22 to communicate with the computer system 102 using any type of communications link. To this extent, the supply voltage/clock frequency control system 18 can manage a set of interfaces (e.g., graphical user interface(s), application program interface, etc.) that enable human and/or system users 22 to interact with the supply voltage/clock frequency control system 18, and allow the temperature sensor(s) 32 to communicate temperature data to the supply voltage/clock frequency control system 18. Further, the supply voltage/clock frequency control system 18 can manage (e.g., store, retrieve, create, manipulate, organize, present, etc.) data, such as IC temperature data 142 (e.g., determined temperature measurements obtained from sensor(s) 32) and/or IC timing data 150 (e.g., slack calculations, raw timing data between locations on IC, etc.) any solution.

In any event, the computer system 102 can comprise one or more general purpose computing articles of manufacture (e.g., computing devices) capable of executing program code, such as the supply voltage/clock frequency control system 18, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the supply voltage/clock frequency control system 18 can be embodied as any combination of system software and/or application software.

Further, the supply voltage/clock frequency control system 18 can be implemented using a set of modules 132. In this case, a module 132 can enable the computer system 102 to perform a set of tasks used by the supply voltage/clock frequency control system 18, and can be separately developed and/or implemented apart from other portions of the supply voltage/clock frequency control system 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of supply voltage/clock frequency control system 18 fixed thereon (e.g., one or more modules 132). However, it is understood that the computer system 102 and supply voltage/clock frequency control system 18 are only representative of various possible equivalent computer systems that may perform a process described herein. To this extent, in other embodiments, the functionality provided by the computer system 102 and supply voltage/clock frequency control system 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC temperature data 142 and/or IC timing data 150 using any solution. For example, the computer system 102 can generate and/or be used to retrieve IC temperature data 142 and/or IC timing data 150 from one or more data stores, receive IC temperature data 142 and/or IC timing data 150 from another system, send IC temperature data 142 and/or IC timing data 150 to another system, etc.

While shown and described herein as methods, systems, and computer program products for controlling a supply voltage and/or clock frequency of an IC, it is understood that aspects of the invention further provide various alternative embodiments. For example, in one embodiment, the invention provides a computer program fixed in at least one computer-readable medium, which when executed, enables a computer system to control a supply voltage and/or clock frequency of an IC. To this extent, the computer-readable medium includes program code, such as the supply voltage/clock frequency control system 18 (FIG. 7), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the supply voltage/clock frequency control system 18 (FIG. 7), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for controlling a supply voltage and/or clock frequency of an IC. In this case, a computer system, such as the computer system 102 (FIG. 7), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

It is understood that aspects of the invention can be implemented as part of a business method that performs a process described herein on a subscription, advertising, and/or fee basis. That is, a service provider could offer to provide a supply voltage/clock frequency control system as described herein. In this case, the service provider can manage (e.g., create, maintain, support, etc.) a computer system, such as computer system 102 (FIG. 7), that performs a process described herein for one or more customers. In return, the service provider can receive payment from the customer(s) under a subscription and/or fee agreement, receive payment from the sale of advertising to one or more third parties, and/or the like.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A method of controlling a supply voltage to an integrated circuit (IC), the method comprising:
    locating a set of temperature sensors on bin locations in the IC;
    determining temperature bounds of the bin locations in the IC as a function of a determined temperature at each of the set of temperature sensors;
    determining timing constraints as a function of a supply voltage at each bin location and the determined temperature at each of the set of temperature sensors; and
    determining operational voltage bounds for the IC as a function of the determined temperature at the set of temperature sensors.

2. The method of claim 1, further comprising constructing circuitry to control the supply voltage to the IC based upon the operational voltage bounds.

3. The method of claim 1, wherein each of the bin location includes a subsection of the IC.

4. The method of claim 1, wherein the determining of the temperature bounds of the bin locations includes:
    associating each bin location (i) with a designated closest temperature sensor ($S_i$);
    performing a thermal analysis of the IC under multiple stimuli (j); and
    determining the temperature bounds for each bin location (i) based on the thermal analysis.

5. The method of claim 4, wherein the determining of the temperature bounds further includes determining a maximum temperature ($T_{max,i}$) for each bin location (i) according to the following equation:

$$T_{max,i} = T_{Si} + \max_j(T_{i,j} - T_{Si,j}),$$

wherein $T_{Si}$=a measured temperature at the closest temperature sensor ($S_i$) to the bin location (i); $T_{i,j}$=a calculated temperature at the bin location (i) in response to a stimulus (j); $T_{Si,j}$=a calculated temperature at the closest temperature sensor ($S_i$) in response to the stimulus (j); and $\max_j$=a function indicating take a maximum of the value in the following parentheses over all values of the stimulus (j).

6. The method of claim 4, wherein the determining of the temperature bounds further includes determining a minimum temperature ($T_{min,i}$) for each bin location (i) according to the following equation:

$$T_{min,i}=T_{Si}-\max_j(T_{Si,j}-T_{i,j}),$$

wherein $T_{Si}$=a measured temperature at the closest temperature sensor ($S_i$) to the bin location (i); $T_{i,j}$=a calculated temperature at the bin location (i) in response to a stimulus (j); $T_{Si,j}$=a calculated temperature at the closest temperature sensor ($S_i$) in response to the stimulus (j); and $\max_j$=a function indicating take a maximum of the value in the following parentheses over all values of the stimulus (j).

7. The method of claim 4, wherein the IC includes a selective voltage binning (SVB) design having a plurality of SVB manufacturing variation windows, each represented by a process point (p), and wherein the performing of the thermal analysis of the IC under multiple stimuli includes performing the thermal analysis of the IC under multiple stimuli at each of the process points (p).

8. The method of claim 7, wherein the determining of the temperature bounds further includes determining at least one of a maximum temperature ($T_{max,i,p}$) for each bin location (i) or a minimum temperature ($T_{min,i,p}$) for each bin location (i) according to the at least one of the following equations:

$$T_{max,i,p}=T_{Si,p}+\max_j(T_{i,j,p}-T_{Si,j,p}),$$

or $$T_{min,i,p}=T_{Si,p}-\max_j(T_{Si,j,p}-T_{i,j,p}),$$

wherein, for each process point (p) for each SVB location: $T_{Si,p}$=a measured temperature at the closest temperature sensor ($S_i$) to the bin location (i); $T_{i,j,p}$=a calculated temperature at the bin location (i) in response to a stimulus (j); $T_{Si,j,p}$=a calculated temperature at the closest temperature sensor ($S_i$) in response to the stimulus (j); and $\max_j$=a function indicating take a maximum of the value in the following parentheses over all values of the stimulus (j).

9. The method of claim 1, wherein each temperature sensor in the set of temperature sensors is separated from each adjacent temperature sensor by a substantially uniform distance.

* * * * *